United States Patent [19]
Aoi et al.

[11] Patent Number: 5,877,080
[45] Date of Patent: Mar. 2, 1999

[54] METHOD OF MANUFACTURING SEMICONDUCTOR DEVICE

[75] Inventors: Nobuo Aoi, Hyogo; Gaku Sugahara, Nara, both of Japan

[73] Assignee: Matsushita Electric Industrial Co.,Ltd., Osaka, Japan

[21] Appl. No.: 777,873

[22] Filed: Dec. 31, 1996

[30] Foreign Application Priority Data

Feb. 9, 1996 [JP] Japan ................................. 8-023622

[51] Int. Cl.⁶ .................................................. H01L 21/441
[52] U.S. Cl. .......................... 438/622; 438/780; 438/782; 438/781
[58] Field of Search .................................. 438/622, 780, 438/781, 782, 787, 790

[56] References Cited

U.S. PATENT DOCUMENTS 4,652,467  3/1987  Brinker et al. .
5,494,858  2/1996  Gnade et al. .

FOREIGN PATENT DOCUMENTS 62-241837  10/1987  Japan .
4-359056   12/1992  Japan .
5-51457     3/1993  Japan .

OTHER PUBLICATIONS

"Heat–resistant Adhesive Using Polyimidesiloxane for Electronic Parts" Special Report II from Industrial Materials, vol. 43, No. 7, pp. 78–84 Jul., 1995.

*Primary Examiner*—Caridad Everhart
*Attorney, Agent, or Firm*—McDermott, Will & Emery

[57] ABSTRACT

A method of manufacturing a semiconductor device comprises a lower-metallization-layer forming step of forming a lower metallization layer on a semiconductor substrate, an insulating-film forming step of forming an interlayer insulating film on said lower metallization layer, and an upper-metallization-layer forming step of forming an upper metallization layer on said interlayer insulating film. The insulating-film forming step includes the step of mixing a solution of a particulate silanol condensate having a fluorine-silicon bond and a solution of a particulate silanol condensate having an organic group-silicon bond to prepare a solution mixture, which is applied onto the semiconductor substrate formed with the lower metallization layer and thermally treated to form the foregoing interlayer insulating film.

18 Claims, 3 Drawing Sheets

METHOD OF MANUFACTURING SEMICONDUCTOR DEVICE

BACKGROUND OF THE INVENTION

The present invention relates to a method of manufacturing a semiconductor device wherein a lower metallization layer, an interlayer insulating film, and an upper metallization layer are formed sequentially on a semiconductor substrate. More particularly, it relates to the technology for reducing the relative dielectric constant of the interlayer insulating film.

In the formation of an interlayer insulating film which is low in relative dielectric constant, there have conventionally been known: (1) a method wherein an oxide film doped with fluorine (SiOF) is formed by plasma CVD; (2) a method wherein a TEOS derivative having an organic group as a substituent is hydrolyzed and condensed by dehydration to prepare a silanol sol, which is applied onto a semiconductor substrate and thermally treated to form a SOG film by a sol-gel process; (3) a method wherein a solution of a siloxane polymer is applied onto a semiconductor substrate and thermally treated to form an interlayer insulating film; and (4) a method wherein a solution of an organic polymer is applied onto a semiconductor substrate and thermally treated to form an interlayer insulating film.

In the first method of forming the interlayer insulating film from a solution of a fluorinated silica sol, the relative dielectric constant of the interlayer insulating film can be reduced to about 3.0 by increasing the content of fluorine. When the content of fluorine is increased, however, the moisture absorbency of the interlayer insulating film is extremely increased, so that a minimum relative dielectric constant that can be used in practice is about 3.5.

The second method of forming the interlayer insulating film from the solution of an organic silica sol presents the problems that the relative dielectric constant of the resulting interlayer insulating film is 3 or more, which is comparatively high, and that the interlayer insulating film is easily decomposed by an oxygen plasma since silicon-organic group bonds are evenly distributed in the film on a molecular level, which may cause side etching in forming a pattern by dry etching or degassing due to decomposition, resulting in adverse effects on the production yield of the device including the occurrence of a crack and increased contact resistance.

In the third method of forming the interlayer insulating film from the solution of a siloxane polymer, the relative dielectric constant of the interlayer insulating film is about 2.5, which is lower than the relative dielectric constant of the interlayer insulating film formed from the solution of a fluorinated silica sol. However, since silicon-organic group bonds are evenly distributed in the film on a molecular level, the interlayer insulating film is easily decomposed by an oxygen plasma, which may cause side etching in forming a pattern by dry etching or degassing due to decomposition, resulting in adverse effects on the production yield of the device including the occurrence of a crack and increased contact resistance.

Although the fourth method of forming the interlayer insulating film from the solution of an organic polymer is advantageous in that the relative dielectric constant of the interlayer insulating film is as low as 2, it has poor compatibility with the semiconductor manufacturing process owing to the problems that the strength of the interlayer insulating film is low because of its low resistance to oxygen plasma and that the heat resistance of the interlayer insulating film is low because of its low glass transition temperature.

SUMMARY OF THE INVENTION

In view of the foregoing, it is the object of the present invention to reduce the relative dielectric constant of an interlayer insulating film without impairing the moisture resistance and heat resistance thereof.

A hybrid material is known to be characterized in that the mixed-system material has its physical properties deviate from additive properties corresponding to the respective ratios of the physical properties of the individual constituent materials and exhibits physical properties peculiar to the mixed system. This is because, when molecules having sizes on the order of nanometers and different compositions and properties are in contact with each other, an interaction which might not be produced between molecules of the same type occurs on the interface between molecules of different types or an interaction produced between molecules of the same type is inhibited with intervention of a molecule of different type, resulting in a change in the high-order structure of the material which forms a material having new physical properties.

The present inventors have made close examinations of the hybrid material and found the phenomenon of an unusual reduction in relative dielectric constant in the mixed system, i.e., the phenomenon that the relative dielectric constant deviates from the additive property corresponding to the mixture ratio. The present invention, which has been achieved based on the foregoing findings, is for forming an interlayer insulating film from a hybrid material obtained by: mixing silica sols having different compositions; mixing a silica sol and an organic polymer; mixing a siloxane polymer and an organic polymer; mixing a siloxane polymer and a silica sol; or mixing organic polymers having different compositions.

A first method of manufacturing a semiconductor device according to the present invention comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a first solution of a silica sol and a second solution of a silica sol having different compositions to prepare a solution mixture, applying the solution mixture onto the semiconductor substrate formed with the lower metallization layer, and thermally treating the applied solution mixture to form the interlayer insulating film.

According to the first method of manufacturing a semiconductor device, the silica sols having different compositions are mixed to form the interlayer insulating film, so that the relative dielectric constant of the obtained interlayer insulating film is lower than that of the insulating film formed from either one of the silica sols. The interlayer insulating film formed from the solution mixture of the solutions of silica sols which are excellent in moisture resistance and resistance to oxygen plasma exhibits improved moisture resistance and improved resistance to oxygen plasma. What results is the interlayer insulating film lower in relative dielectric constant than the insulating film formed from either one of the first and second silica sol solutions.

In the first method of manufacturing a semiconductor device, the first solution of a silica sol is preferably a solution of a particulate silanol condensate having a fluorine-silicon bond and the second solution of a silica sol is preferably a solution of a particulate silanol condensate having an organic group-silicon bond.

In accordance with the method, the interlayer insulating film is formed through the application of the mixture of the solution of a particulate silanol condensate having a fluorine-silicon bond which forms an insulating film low in moisture resistance but comparatively high in resistance to oxygen plasma and the solution of a particulate silanol condensate having an organic group-silicon bond which forms an insulating film inferior in resistance to oxygen plasma but low in relative dielectric constant and high in moisture resistance. Therefore, the resulting interlayer insulating film has the combined advantages of the two materials, which are the low relative dielectric constant, high moisture resistance, and high resistance to oxygen plasma.

In the first method of manufacturing a semiconductor device, the first solution of a silica sol is preferably a solution of a particulate silanol condensate having a fluorine-silicon bond and the second solution of a silica sol is preferably a solution of a particulate silanol condensate having a hydrogen-silicon bond.

In accordance with the method, the interlayer insulating film is formed through the application of the mixture of the solution of a particulate silanol condensate having a fluorine-silicon bond which forms an insulating film inferior in moisture resistance but comparatively low in relative dielectric constant and the solution of a particulate silanol condensate having a hydrogen-silicon bond which forms an insulating film high in relative dielectric constant but excellent in moisture resistance. Therefore, the resulting interlayer insulating film has the combined advantages of the two materials, which are the low relative dielectric constant and excellent moisture resistance.

In the first method of manufacturing the semiconductor device, the first solution of a silica sol is preferably a solution of a particulate silanol condensate having a first organic group-silicon bond and the second solution of a silica sol is preferably a solution of a particulate silanol condensate having a second organic group-silicon bond different from the first organic group-silicon bond.

In accordance with the manufacturing method, the interlayer insulating film lower in relative dielectric constant than the insulating film formed from the solution of only one particulate silanol condensate is formed through the application of the mixture of the solutions of different particulate silanol condensates having different organic group-silicon bonds.

In the first method of manufacturing a semiconductor device, the first solution of a silica sol is preferably a solution of a particulate silanol condensate having an organic group-silicon bond and the second solution of a silica sol is preferably a solution of a particulate silanol condensate having a hydrogen-silicon bond.

In accordance with the method, the interlayer insulating film is formed through the application of the mixture of the solution of a particulate silanol condensate having an organic group-silicon bond which forms an insulating film inferior in resistance to oxygen plasma but low in relative dielectric constant and the solution of a particulate silanol condensate having a hydrogen-silicon bond which forms an insulating film disadvantageously high in relative dielectric constant but excellent in resistance to oxygen plasma. Therefore, the resulting insulating film has the combined advantages of the two materials, which are the low relative dielectric constant and excellent resistance to oxygen plasma.

A second method of manufacturing a semiconductor device according to the present invention comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a solution of a ladder siloxane polymer and a solution of a silica sol to prepare a solution mixture, applying the solution mixture onto the semiconductor substrate formed with the lower metallization layer, and thermally treating the applied solution mixture to form the interlayer insulating film.

According to the second method of manufacturing a semiconductor device, the interlayer insulating film is formed by mixing the solution of a ladder siloxane polymer and the solution of a silica sol and applying the resulting solution mixture onto the semiconductor substrate. Therefore, the resulting interlayer insulating film is lower in relative dielectric constant than the interlayer insulating film formed only from the solution of a ladder siloxane polymer or the solution of a silica sol.

In the second method of manufacturing a semiconductor device, the solution of a silica sol is preferably a solution of a particulate silanol condensate having a hydrogen-silicon bond, a solution of a particulate silanol condensate having an oxygen-silicon bond, a solution of a particulate silanol condensate having an organic group-silicon bond, or a solution of a particulate silanol condensate having a fluorine-silicon bond.

In accordance with the method, the resulting interlayer insulating film has the combined advantages of the insulating films formed individually from the foregoing solutions of the particulate silanol condensates. In the case where the solution of a silica sol is the solution of a particulate silanol condensate having an oxygen-silicon bond, in particular, the resulting interlayer insulating film has high resistance to oxygen plasma comparable to the resistance to oxygen plasma of the insulating film formed from the solution of an inorganic silanol sol and high moisture resistance comparable to the moisture resistance of the insulating film formed from the solution of a ladder siloxane polymer.

In the second method of manufacturing a semiconductor device, the solution mixture is preferably prepared by mixing the solution of a ladder siloxane polymer in a concentration of 10 to 90 wt % in terms of $SiO_2$ and the solution of a silica sol in a concentration of 90 to 10 wt % in terms of $SiO_2$. This ensures the achievement of the intrinsic effects of the second method of manufacturing a semiconductor device.

A third method of manufacturing a semiconductor device according to the present invention comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a solution of an organic polymer and a solution of a silica sol to prepare a solution mixture, applying the solution mixture onto the semiconductor substrate formed with the lower metallization layer, and thermally treating the applied solution mixture to form the interlayer insulating film.

According to the third method of manufacturing a semiconductor device, the interlayer insulating film is formed through the application of the mixture of the solution of an organic polymer which forms an insulating film disadvantageously low in resistance to oxygen plasma and in glass transition temperature but advantageously low in relative dielectric constant and the solution of a silica sol which forms an insulating film comparatively high in relative dielectric constant but advantageously high in resistance to oxygen plasma and in glass transition temperature. Therefore, the resulting interlayer insulating film has the combined advantages of the two materials, which are the high resistance to oxygen plasma, high glass transition temperature, and low relative dielectric constant.

In the third method of manufacturing a semiconductor device, the solution of an organic polymer preferably contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond. This ensures the preparation of the solution of an organic polymer which forms an insulating film low in relative dielectric constant.

In the third method of manufacturing a semiconductor device, the silica sol solution is preferably a solution of a particulate silanol condensate having a hydrogen-silicon bond, a solution of a particulate silanol condensate having an oxygen-silicon bond, a solution of a particulate silanol condensate having an organic group-silicon bond, or a solution of a particulate silanol condensate having a fluorine-silicon bond. This ensures the preparation of the solution of a silica sol which is high in resistance to oxygen plasma and in glass transition temperature.

A fourth method of manufacturing a semiconductor device comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a solution of a ladder siloxane polymer and a solution of an organic polymer to prepare a solution mixture, applying the solution mixture onto the semiconductor substrate formed with the lower metallization layer, and thermally treating the applied solution mixture to form the interlayer insulating film.

According to the fourth method of manufacturing a semiconductor device, the interlayer insulating film is formed by mixing the solution of a ladder siloxane polymer and the solution of an organic polymer and applying the resulting solution mixture onto the semiconductor substrate. Therefore, the resulting interlayer insulating film has a relative dielectric constant lower than that of the interlayer insulating film formed from either one of the solution of a ladder siloxane polymer and the solution of an organic polymer.

In the fourth method of manufacturing a semiconductor device, the solution of an organic polymer preferably contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond. This ensures the preparation of the solution of an organic polymer which forms an insulating film low in relative dielectric constant.

A fifth method of manufacturing a semiconductor device according to the present invention comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a solution of polyhedral silsesquioxane and a solution of a silica sol to prepare a solution mixture, applying the solution mixture onto the semiconductor substrate formed with the lower metallization layer, and thermally treating the applied solution mixture to form the interlayer insulating film.

Although the insulating film formed from the solution of polyhedral silsesquioxane is characterized by a low relative dielectric constant which is increased by a volume reduction caused by the thermal treatment, the thermal denaturation of polyhedral silsesquioxane is suppressed in the interlayer insulating film formed from the mixture of the solution of polyhedral silsesquioxane and the solution of a silica sol according to the fifth method of manufacturing a semiconductor device, so that a volume reduction and an increase in relative dielectric constant are prevented accordingly. Therefore, the resulting interlayer insulating film is low in relative dielectric constant and free from disadvantages including a contact failure and a reduction in reliability.

In the fifth method of manufacturing a semiconductor device, the silica sol solution is preferably a solution of a particulate silanol condensate having a hydrogen-silicon bond, a solution of a particulate silanol condensate having an oxygen-silicon bond, a solution of a particulate silanol condensate having an organic group-silicon bond, or a solution of a particulate silanol condensate having a fluorine-silicon bond. This ensures the preparation of the solution of a silica sol which can suppress the thermal denaturation of polyhedral silsesquioxane.

A sixth method of manufacturing a semiconductor device comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a solution of polyhedral silsesquioxane and a solution of an organic polymer to prepare a solution mixture, applying the solution mixture onto the semiconductor substrate formed with the lower metallization layer, and thermally treating the applied solution mixture to form the interlayer insulating film.

According to the sixth method of manufacturing a semiconductor device, the interlayer insulating film is formed by mixing the solution of polyhedral silsesquioxane and the solution of an organic polymer and applying the resulting solution mixture onto the semiconductor device. Therefore, the resulting interlayer insulating film is lower in relative dielectric constant than the interlayer insulating films formed individually from the solution of polyhedral silsesquioxane and the solution of an organic polymer.

In the sixth method of manufacturing a semiconductor device, the solution of an organic polymer preferably contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond. This ensures the preparation of the organic polymer solution which forms an insulating film low in relative dielectric constant.

A seventh method of manufacturing a semiconductor device according to the present invention comprises: a lower-metallization-layer forming step of forming a lower metallization layer on a semiconductor substrate; an insulating-film forming step of forming an interlayer insulating film on the lower metallization layer; and an upper-metallization-layer forming step of forming an upper metallization layer on the interlayer insulating film, wherein the insulating-film forming step includes a step of mixing a first solution of an organic polymer and a second solution of an organic polymer having different compositions to prepare a solution mixture, applying the solution mixture onto the semiconductor substrate formed with the lower metallization layer, and thermally treating the applied solution mixture to form the interlayer insulating film.

According to the seventh method of manufacturing a semiconductor device, the interlayer insulating film is formed by mixing the first and second solutions of the organic polymers having different compositions and applying the resulting solution mixture onto the semiconductor substrate. Therefore, the resulting interlayer insulating film is lower in relative dielectric constant than the insulating films formed individually from the first and second solutions of the organic polymers.

In the seventh method of manufacturing a semiconductor device, the first or second solution of an organic polymer preferably contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond. This ensures the preparation of the organic polymer which forms an insulating film low in relative dielectric constant.

Figure 1:
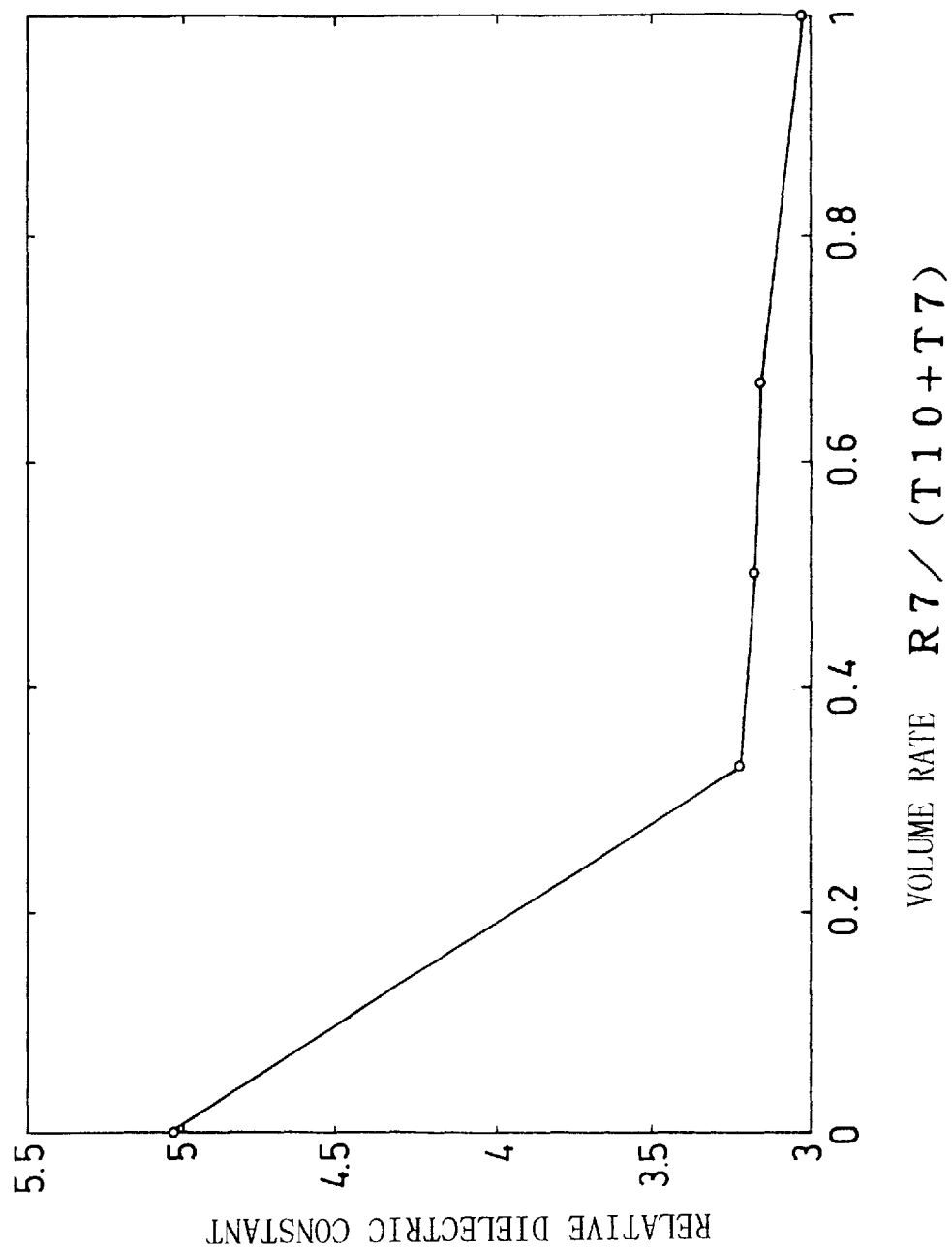
FIG. 1 is a graph showing the relationship between a relative dielectric constant and the mixture ratios of an organic silica sol solution and a hydrogenated silica sol solution in a first embodiment of a method of manufacturing a semiconductor device according to the present invention.

DETAILED DESCRIPTION OF THE INVENTION (First Embodiment)

In a first embodiment, first and second silica sol solutions having different compositions are mixed to prepare a solution mixture, which is applied onto a semiconductor substrate formed with a lower metallization layer and then thermally treated to form an interlayer insulating film.

(EXAMPLE 1)

As the first silica sol solution, 50 ml of a solution of a silica sol (in a concentration of 10 wt % in terms of $SiO_2$) is prepared by sequentially subjecting triethoxyfluorosilane to a hydrolysis process and a condensation process by dehydration, while 100 ml of a solution of an organic silica sol having a methyl group-silicon bond (a commercially available inorganic SOG solution in a concentration of 10 wt % in terms of $SiO_2$) is prepared as the second silica sol solution. Then, the first and second silica sol solutions are mixed and stirred at room temperature for 3 hours to prepare a solution mixture, which is applied onto a semiconductor substrate by spin coating at 3000 r.p.m., baked on a hot plate oven at a varying temperature of 100° C. for 1 minute, 150° C. for 1 minute, and 200° C. for 1 minute, and thermally treated in an atmosphere of nitrogen in an electric furnace at a temperature of 400° C. for 30 minutes to form an interlayer insulating film having a thickness of 380 nm. Although the concentration of each of the first and second silica sol solutions can be determined properly as long as the interlayer insulating film can be formed, the concentration is preferably in the range of about 3 to 20 wt % in terms of $SiO_2$.

The interlayer insulating film obtained in Example 1 is measured by infrared spectroscopy, with the result that an absorption peak based on a fluorine-silicon bond and a methyl group-silicon bond is observed, which confirms the formation of a hybrid film.

The relative dielectric constant of the interlayer insulating film obtained in Example 1 is measured to be about 2.3.

A silicon dioxide film is deposited by CVD to a thickness of 100 nm on the interlayer insulating film formed in Example 1. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is less conspicuous than side etching observed in the interlayer insulating film formed only from the organic silica sol.

The contact resistance of the contact hole formed in the interlayer insulating film obtained in Example 1 is measured, which is substantially equal to the contact resistance measured in the case of using a normal CVD film as the interlayer insulating film.

In the interlayer insulating film obtained in Example 1, a variation in relative dielectric constant resulting from added moisture is hardly observed.

The insulating film formed by sequentially subjecting triethoxyfluorosilane to the hydrolysis process and the condensation process by dehydration is comparatively low in relative dielectric constant but disadvantageously high in moisture absorbency. On the other hand, the insulating film formed from the organic silica sol is low in moisture absorbency because of its low relative dielectric constant and dense texture but inferior in resistance to oxygen plasma. In Example 1, the insulating film low in relative dielectric constant and high in moisture resistance and in resistance to oxygen plasma can be obtained.

Due to the effect of the fluorinated silica sol component excellent in resistance to oxygen plasma, side etching is hardly observed in the contact hole even when ashing is performed with respect to the interlayer insulating film obtained in Example 1 by using an oxygen plasma. Due to the effect of the organic silica sol component having water repellency, the interlayer insulating film obtained in Example 1 absorbs a reduced amount of moisture. Thus, by hybridizing the organic silica sol and the fluorinated silica sol, the advantages of the two materials are combined to form the interlayer insulating film lower in relative dielectric constant than the insulating films formed individually from the solution of an organic silica sol and the solution of a fluorinated silica sol.

By varying the mixture ratios of the organic silica sol and the fluorinated silica sol, the relative dielectric constant and moisture resistance of the resulting interlayer insulating film can be controlled. In other words, as the ratio of the organic silica sol is increased, the moisture resistance is increased but the resistance to oxygen plasma is reduced. As the ratio of the fluorinated silica sol is decreased, the relative dielectric constant is increased but the moisture resistance is reduced. The system of concern is characterized in that a low relative dielectric constant equal to or less than the relative dielectric constant of the insulating film formed only from the solution of a fluorinated silica sol can be obtained at the ratio of the fluorinated silica sol on the order of 30 vol %. Although the ratios of the two materials can be varied in accordance with the quality required of the interlayer insulating film, the fluorinated silica sol is preferably used at the ratio of 10 to 90 vol % in practice.

(EXAMPLE 2)

A solution of a fluorinated silica sol is used as the first silica sol solution and a solution of a hydrogenated silica sol is used as the second silica sol solution. The interlayer insulating film formed from the hybridized solution mixture of the fluorinated silica sol and hydrogenated silica sol exhibits high resistance to oxygen plasma, high moisture resistance, and a low relative dielectric constant. When the mixture ratio of the fluorinated silica sol is 30 vol %, the resulting interlayer insulating film has a relative dielectric constant of about 2.4.

(EXAMPLE 3)

A first solution of an organic silica sol having a phenyl group-silicon bond is used as the first silica sol solution, while a second solution of an organic silica sol having a methyl group-silicon bond is used as the second silica sol solution. The interlayer insulating film formed from the solution mixture has a relative dielectric constant of about 2.5.

As the organic group composing the organic group-silicon bond contained in the first and second solutions of the organic silica sols, an alkyl group, a fluoroalkyl group, a cyclic alkyl group, or an aryl group may be used. However, different organic groups should be used to compose the organic group-silicon bonds contained in the first and second solutions of the organic silica sols.

(EXAMPLE 4)

A solution of an organic silica sol having an organic group-silicon bond is used as the first silica sol solution and a solution of a hydrogenated silica sol is used as the second silica sol solution. As the organic group composing the organic group-silicon bond contained in the solution of an organic silica sol, an alkyl group, a fluoroalkyl group, a cyclic alkyl group, a cyclic fluoroalkyl group, an aryl group such as a phenyl group, or a fluoroaryl group may be used. The relative dielectric constant obtained when the mixture ratio of the organic silica sol is 35 vol % is about 3, showing excellent moisture resistance and resistance to oxygen plasma.

FIG. 1 shows the relationship between the relative dielectric constant of an insulating film formed from the solution mixture of R7 (commercially available from Hitachi Chemical Co., Ltd.) as the organic silica sol and T10 (commercially available from Tokyo Ohka Kogyo Co., Ltd.) as the hydrogenated silica sol and the volume ratio R7/(T10+R7). As is apparent from FIG. 1, the relative dielectric constant is greatly reduced when 35 vol % or more of R7 is contained.

(Second Embodiment)

In a second embodiment, a solution of a ladder siloxane polymer and a solution of a silica sol are mixed to prepare a mixture solution, which is applied onto a semiconductor substrate formed with a lower metallization layer and thermally treated to form an interlayer insulating film.

(Example)

As the solution of a ladder siloxane polymer, 50 ml of a solution of phenyl silsesquioxane (in a concentration 10 wt % in terms of $SiO_2$) is prepared, while 100 ml of a solution of an inorganic silica sol having only oxygen-silicon bonds (in a concentration of 10 wt % in terms of $SiO_2$) is prepared as the solution of a silica sol. The solution of a ladder siloxane polymer and the solution of a silica sol are mixed and stirred at room temperature for 3 hours to prepare the mixture solution, which is applied onto a semiconductor substrate by spin coating at 3000 r.p.m., baked on a hot plate oven at a temperature of 150° C. for 2 minutes, and thermally treated in an atmosphere of nitrogen in an electric furnace at a temperature of 450° C. for 30 minutes to form an interlayer insulating film having a thickness of about 450 nm. Although the concentration of the solution of a ladder siloxane polymer or the solution of a silica sol in the solution mixture can be determined properly as long as the interlayer insulating film can be formed, the concentration is preferably in the range of about 3 to 20 wt % in terms of $SiO_2$.

The relative dielectric constant of the interlayer insulating film obtained in the present example is measured to be about 2.4.

A silicon dioxide film is deposited by CVD to a thickness of 100 nm on the interlayer insulating film obtained in the present example. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is hardly observed.

The contact resistance of the contact hole formed in the interlayer insulating film is measured in the present example, which is substantially equal to the contact resistance measured in the case of using a normal CVD film as the interlayer insulating film.

The relative dielectric constant of the insulating film formed only from the solution of phenyl silsesquioxane is about 2.5, while the relative dielectric constant of the insulating film formed only from the solution of an inorganic silica sol is about 10. From the mixture of the two solutions, there can be formed the interlayer insulating film having high resistance to oxygen plasma comparable to the resistance to oxygen of the inorganic silica sol, low moisture absorbency comparable to the moisture absorbency of phenyl silsesquioxane, and a relative dielectric constant lower than that of the insulating film formed from either one of the two materials.

For practical use, the ratio of phenyl silsesquioxane to the inorganic silica sol in the solution mixture is preferably 10 to 90 vol % in terms of $SiO_2$. When the ratio of the inorganic sol is adjusted to be 50 vol % or more, the relative dielectric constant can be reduced significantly.

Although the present example has used the ladder siloxane polymer having a phenyl group as the ladder siloxane polymer, a siloxane polymer having a hydrogen-silicon bond, or a siloxane polymer having an alkyl group such as a methyl group, a fluoroalkyl group, a cyclic alkyl group, a cyclic fluoroalkyl group, an aryl group such as a phenyl group, or a fluoroalkyl group may be used instead.

As the silica sol, a hydrogenated silica sol, an organic silica sol, a fluorinated silica sol, or the like may also be used instead of the inorganic silica sol.

(Third Embodiment)

In a third embodiment, a solution of an organic polymer and a solution of a silica sol are mixed to prepare a solution mixture, which is applied onto a semiconductor substrate formed with a lower metallization layer and thermally treated to form an interlayer insulating film.

(Example)

As the solution of an organic polymer, 50 ml of a solution of perfluoropolyether (in a concentration of 10 wt %) is prepared, while 100 ml of a solution of an inorganic silica sol having only oxygen-silicon bonds (in a concentration of 10 wt %) is prepared as the solution of a silica sol. The solution of an organic polymer and the solution of a silica sol are mixed and stirred as room temperature for 3 hours to prepare the solution mixture, which is applied onto a semiconductor substrate by spin coating at 3000 r.p.m., baked on a hot plate oven at a temperature of 150° C. for 2 minutes, and thermally treated in an atmosphere of nitrogen in an electric furnace at 400° C. for 30 minutes to form an interlayer insulating film having a thickness of about 450 nm.

The relative dielectric constant of the interlayer insulating film obtained in the present example is measured by a CV method to be about 2.1.

A silicon dioxide film is deposited by CVD to a thickness of 100 nm on the interlayer insulating film obtained in the present example. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is hardly observed.

The contact resistance of the contact hole formed in the interlayer insulating film is measured in the present example, which is substantially equal to the contact resistance measured in the case of using a normal CVD film as the interlayer insulating film.

By using the mixture of the solution of an organic polymer and the solution of an inorganic silica sol, there can be formed the insulating film having a high resistance to oxygen plasma and a high glass transition temperature (about 600° C.) comparable to the resistance to oxygen plasma and glass transition temperature of the insulating film formed from the inorganic silica sol, high moisture resistance comparable to the moisture resistance of the insulating film formed from the organic polymer, and a relative dielectric constant lower than those of the insulating films formed individually from the two materials.

For practical use, the ratio of the organic polymer to the inorganic silica sol in the solution mixture is preferably 10 to 90 vol %.

In general, the glass transition temperature of an organic polymer is as low as 200° C. or less. In the semiconductor manufacturing process, an additional thermal treatment such as sintering (400° C. or higher) is performed after the formation of the interlayer insulating film. Accordingly, if the organic polymer low in glass transition temperature is used singly, a volume increase or flow occurs in the interlayer insulating film under the thermal treatment, resulting in various disadvantages including the development of a stress, a break in wiring, a contact failure, and a reduction in reliability. However, since the present embodiment has used the organic polymer containing fluorocarbon as the main component, the resulting interlayer insulating film is high in heat resistivity. Moreover, since a polysiloxane skeleton has been introduced into the organic polymer, the glass transition temperature of the organic polymer which is intrinsically low can be adjusted to be equal to the glass transition temperature of a silica sol glass.

Siloxane-modified polyimide obtained through copolymerization between siloxane and an organic polymer has been developed for the purpose of improving the heat resistance of the organic polymer (see Industrial Materials, vol. 43, No. 7, p. 78). The siloxane-modified polyimide has a low glass transition temperature of 190° C. since the polysiloxane skeleton has not been formed therein. In the present example, by contrast, the interlayer insulating film is formed from the hybridized mixture of the solution of an organic polymer and the solution of a silica sol, so that the resulting interlayer insulating film is suitable for use in a semiconductor device.

As the solution of an organic polymer, there may be used a solution containing at least one of an organic polymer having in the skeleton thereof a carbon-carbon bond, an organic polymer having in the skeleton thereof a carbon-oxygen bond, an organic polymer having in the skeleton thereof a carbon-fluorine bond, an organic polymer having in the skeleton thereof an aromatic hydrocarbon having or not having a fluorine-carbon bond and an oxygen, benzocyclobutene, and a benzocyclobutene derivative having or not having a carbon-fluorine bond. Examples of the organic polymer having a carbon-carbon bond in the skeleton thereof include a polyethylene derivative, a polystyrene derivative, a polyvinylphenol derivative, and a teflon derivative. Examples of the organic polymer having a carbon-oxygen or fluorine-carbon bond in the skeleton thereof include perfluoropolyether and fluorinated polyalkylene having an ether bond. Examples of the organic polymer having an aromatic hydrocarbon having or not having a fluorine-carbon bond and an oxygen in the skeleton thereof include polyimide prepolymer, fluorinated polyimide prepolymer, polyallylene, fluorinated polyallylene, and a siloxane-modified polyimide derivative. Examples of the benzocyclobutene derivative include a benzocyclobutene prepolymer and a siloxane-modified benzocyclobutene prepolymer. It is also possible to use, in the side chain or skeleton of each of these organic polymers, an organic polymer having a polar group highly interactive with a silanol group in the silica sol (e.g., an amino group, an imide group, a hydroxyl group, a carbonyl group, a carboxyl group, an amide group, a carbon-carbon unsaturated bond, or the like).

As the silica sol, a hydrogenated silica sol, an organic silica sol, or a fluorinated silica sol may be used instead of the inorganic silica sol.

(Fourth Embodiment)

In a fourth embodiment, a solution of a ladder siloxane polymer and a solution of an organic polymer are mixed to prepare a solution mixture, which is applied onto a semiconductor substrate formed with a lower metallization layer and thermally treated to form an interlayer insulating film.

(Example)

As the solution of a ladder siloxane polymer, 50 ml of a solution of phenyl silsesquioxane (in a concentration of 10 wt % in terms of $SiO_2$) is prepared, while 100 ml of a solution of benzocyclobutene prepolymer (in a concentration of 10 wt %) is prepared as the solution of an organic polymer. The solution of a ladder siloxane polymer and the solution of an organic polymer are mixed and stirred at room temperature for 3 hours to prepare a solution mixture, which is applied onto a semiconductor substrate by spin coating at 3000 r.p.m., baked on a hot plate oven at a temperature of 150° C. for 2 minutes, and thermally treated in an atmosphere of nitrogen in an electric furnace at a temperature of 450° C. for 30 minutes to form an interlayer insulating film having a thickness of 450 nm. Although the concentrations of benzocyclobutene and phenyl silsesquioxane in the solution mixture can be determined properly as long as the interlayer insulating film can be formed, the concentrations are preferably in the range of about 3 to 20 wt %.

The relative dielectric constant of the interlayer insulating film obtained in the present example is measured to be about 2.2.

A silicon dioxide film is deposited by CVD to a thickness of 100 nm on the interlayer insulating film formed in the present example. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is less conspicuous than side etching observed in a benzocyclobutene polymer film.

The contact resistance of the contact hole formed in the interlayer insulating film obtained in the present example is measured, which is substantially equal to the contact resistance measured in the case of using a normal CVD film as the interlayer insulating film.

Although an insulating film formed only from phenyl silsesquioxane has a relative dielectric constant of about 2.5 and an insulating film formed only from benzocyclobutene has a relative dielectric constant of about 2.7, an interlayer insulating film having a relative dielectric constant lower than those of the two insulating films can be formed from the solution mixture.

For practical use, the ratio of phenyl silsesquioxane to benzocyclobutene in the solution mixture is preferably 10 to 90 vol %.

In general, the glass transition temperature of the organic polymer is as low as 200° C. or less. In the semiconductor manufacturing process, an additional thermal treatment such as sintering (400° C. or higher) is performed after the formation of the interlayer insulating film. Accordingly, if the organic polymer low in glass transition temperature is used singly, a volume increase or flow occurs in the interlayer insulating film under the thermal treatment, resulting in various disadvantages including the development of a stress, a break in wiring, a contact failure, and a reduction in reliability. However, since the present example has introduced the polysiloxane skeleton into the organic polymer, the glass transition temperature of the organic polymer which is intrinsically low can be adjusted to be equal to the glass transition temperature of a silica sol glass. Moreover, since the interlayer insulating film is formed from the hybridized mixture of the solution of an organic polymer and the solution of a ladder siloxane polymer in the present embodiment, the resulting interlayer insulating film is suitable for use in a semiconductor device, similarly to the third embodiment.

Although the ladder siloxane polymer having a phenyl group has been used as the ladder siloxane polymer, a siloxane polymer having a hydrogen-silicon bond, or a siloxane polymer having an alkyl group such as a methyl group, a fluoroalkyl group, a cyclic alkyl group, a cyclic fluoroalkyl group, an aryl group such as a phenyl group, or a fluoroalkyl group may be used instead.

As the solution of an organic polymer, there may be used a solution containing at least one of an organic polymer having in the skeleton thereof a carbon-carbon bond, an organic polymer having in the skeleton thereof a carbon-oxygen bond, an organic polymer having in the skeleton thereof a carbon-fluorine bond, an organic polymer having in the skeleton thereof an aromatic hydrocarbon having or not having a fluorine-carbon bond and an oxygen, benzocyclobutene, and a benzocyclobutene derivative having or not having a carbon-fluorine bond. Examples of the organic polymer having a carbon-carbon bond in the skeleton thereof include a polyethylene derivative, a polystyrene derivative, a polyvinylphenol derivative, and a teflon derivative. Examples of the organic polymer having a carbon-oxygen or fluorine-carbon bond in the skeleton thereof include perfluoropolyether and fluorinated polyalkylene having an ether bond. Examples of the organic polymer having an aromatic hydrocarbon having or not having a fluorine-carbon bond and an oxygen in the skeleton thereof include polyimide prepolymer, fluorinated polyimide prepolymer, polyallylene, fluorinated polyallylene, and a siloxane-modified polyimide derivative. Examples of the benzocyclobutene derivative include a benzocyclobutene prepolymer and a siloxane-modified benzocyclobutene prepolymer. It is also possible to use, in the side chain or skeleton of each of these organic polymers, an organic polymer having a polar group highly interactive with a silanol group in the silica sol (e.g., an amino group, an imide group, a hydroxyl group, a carbonyl group, a carboxyl group, an amide group, a carbon-carbon unsaturated bond, or the like).

(Fifth Embodiment)

In a fifth embodiment, a solution of polyhedral silsesquioxane and a solution of a silica sol is mixed to prepare a solution mixture, which is applied onto a semiconductor substrate formed with a lower metallization layer and thermally treated to form an interlayer insulating film.

(Example)

As the solution of polyhedral silsesquioxane, 50 ml of a solution of cage-structured hydrogenated silsesquioxane (in a concentration of 10 wt % in terms of $SiO_2$) is prepared, while 100 ml of a solution of an inorganic silica sol (in a concentration of 10 wt % in terms of $SiO_2$) is prepared as the solution of a silica sol. The solution of polyhedral silsesquioxane and the solution of a silica sol are mixed and stirred at room temperature for 3 hours to prepare a solution mixture, which is applied onto a semiconductor substrate by spin coating at 3000 r.p.m., baked on a hot plate oven at a temperature of 150° C. for about 2 minutes, and thermally treated in an atmosphere of nitrogen in an electric furnace at a temperature of 400° C. for 30 minutes to form an interlayer insulating film having a thickness of about 450 nm. Although the concentrations of the silica sol and hydrogenated silsesquioxane in the solution mixture can be determined properly as long as the interlayer insulating film can be formed, the concentrations are preferably in the range of about 3 to 20 wt %.

The relative dielectric constant of the interlayer insulating film obtained in the present embodiment is measured by a CV method to be about 2.2.

A silicon dioxide film is deposited by CVD to a thickness of 100 nm on the interlayer insulating film formed in the present example. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is hardly observed.

The contact resistance of the contact hole formed in the interlayer insulating film according to the present example is measured to be substantially equal to the contact resistance measured in the case of using a normal CVD film as the interlayer insulating film.

By mixing cage-structured hydrogenated silsesquioxane and the inorganic silica sol, there can be formed the interlayer insulating film having a low relative dielectric constant comparable to the relative dielectric constant of cage-structured silsesquioxane, a high glass transition temperature (about 600° C.) comparable to the glass transition temperature of the inorganic silica sol, and a relative dielectric constant lower than those of the insulating films formed individually from the solution of cage-structured silsesquioxane and the solution of a silica sol.

For practical use, the ratio of cage-structured silsesquioxane to the inorganic silica sol is preferably 10 to 90 vol %.

In general, the condensation of cage-structured silsesquioxane proceeds to varying degrees depending on the temperature for the thermal treatment. In the semiconductor manufacturing process, an additional thermal treatment such as sintering (400° C. or higher) is performed after the formation of the interlayer insulating film. Accordingly, if the cage-structured silsesquioxane is used singly, a volume reduction and an increase in relative dielectric constant occur during the thermal treatment, resulting in various disadvantages including the development of a stress, a break in wiring, a contact failure, and a reduction in reliability. However, since the present embodiment has introduced the rigid polysiloxane skeleton formed through the condensation of the silica sol into cage-structured silsesquioxane low in relative dielectric constant, cage-structured silsesquioxane can be prevented from being denatured by the thermal treatment, while the interlayer insulating film low in relative dielectric constant can be formed.

As the silica sol, a hydrogenated silica sol, an organic silica sol, or a fluorinated silica sol may be used instead of the inorganic silica sol.

(Sixth Embodiment)

In a sixth embodiment, a solution of polyhedral silsesquioxane and a solution of an organic polymer are mixed to prepare a solution mixture, which is applied onto a semiconductor substrate formed with a lower metallization layer and thermally treated to form an interlayer insulating film.

(Example)

As the solution of polyhedral silsesquioxane, 50 ml of a solution of cage-structured hydrogenated silsesquioxane (in a concentration of 10 wt % in terms of $SiO_2$) is prepared and 100 ml of a solution of benzocyclobutene (using a commercially available inorganic SOG solution in a concentration of 10 wt % in terms of $SiO_2$) is prepared as the solution of an organic polymer. The solution of cage-structured hydrogenated silsesquioxane and the solution of an organic polymer are mixed and stirred at room temperature for 3 hours to prepare a solution mixture, which is applied onto a semiconductor substrate by spin coating at 3000 r.p.m., baked on a hot plate oven at a varying temperature of 100° C. for 1 minute, 150° C. at 1 minute, and 200° C. for 1 minute, and thermally treated in an atmosphere of nitrogen in an electric furnace at a temperature of 400° C. for 30 minutes to form an interlayer insulating film having a thickness of about 460 nm. Although the concentration of cage-structured hydrogenated silsesquioxane in the solution mixture is determined properly as long as the interlayer insulating film can be formed, it is preferably in the range of about 3 to 20 wt %.

The relative dielectric constant of the interlayer insulating film obtained in the present example is measured by a CV method to be about 2.1.

An oxide film is deposited by CVD to a thickness of 100 nm on the interlayer insulating film formed in the present example. Subsequently, a pattern with a contact hole is formed from a photoresist deposited on the oxide film by a normal lithographic process, followed by dry etching performed with respect to the interlayer insulating film and CVD oxide film to form the contact hole. Thereafter, the photoresist is removed by ashing using an oxygen plasma. The configuration of the contact hole thus formed is observed by using an electronic microscope, with the result that side etching is hardly observed.

The contact resistance of the contact hole formed in the interlayer insulating film according to the foregoing example is measured, which is substantially equal to the contact resistance measured in the case of using a normal CVD film as the interlayer insulating film.

Moreover, a variation in relative dielectric constant resulting from added moisture is hardly observed. Due to the effect of the siloxane polymer resistant to oxygen plasma, side etching is hardly observed. Due to the effect of the benzocyclobutene polymer having water repellency, the interlayer insulating film absorbs a reduced amount of moisture.

The relative dielectric constant of the insulating film obtained through the condensation of cage-structured silsesquioxane is as low as about 2.2. On the other hand, the relative dielectric constant of the insulating film obtained from benzocyclobutene is about 2.7. By hybridizing the two materials, the present embodiment achieves the formation of the interlayer insulating film which is lower in relative dielectric constant than the interlayer insulating films formed individually from the solution of cage-structured hydrogenated silsesquioxane and the solution of benzocyclobutene and excellent in resistance to oxygen plasma and in moisture resistance.

Although cage-structured hydrogenated silsesquioxane can form an insulating film having a low-density texture and a relative dielectric constant as low as about 2.2, the texture thereof increases in density as the temperature for the thermal treatment increases, while the relative dielectric constant becomes 2.2 to 3.5 and the volume reduces. Accordingly, the insulating film formed from cage-structured hydrogenated silsesquioxane has poor compatibility with the semiconductor manufacturing process involving the thermal treatment such as sintering after the formation of the interlayer insulating film. However, since the benzocyclobutene polymer contained in the hybrid material forms the skeleton structure of the interlayer insulating film in the present embodiment, a volume reduction resulting from the condensation process in cage-structured hydrogenated silsesquioxane promoted by the thermal treatment can be lessened. Through the hybridization of the two materials, the advantages of the two materials are combined with each other, while the relative dielectric constant becomes lower than in the case where each of the two materials is used singly.

The system is characterized in that, when cage-structured silsesquioxane is added to benzocyclobutene at a ratio of 30 wt %, a material having a relative dielectric constant equal to or lower than that of the insulating film formed from silsesquioxane can be formed. Although the mixture ratio can be varied depending on the quality required of the insulating film, the ratio of cage-structured silsesquioxane in the solution mixture is preferably 10 to 90 vol % for practical use.

As the solution of an organic polymer, there may be used a solution containing at least one of an organic polymer having in the skeleton thereof a carbon-carbon bond, an organic polymer having in the skeleton thereof a carbon-oxygen bond, an organic polymer having in the skeleton thereof a carbon-fluorine bond, an organic polymer having in the skeleton thereof an aromatic hydrocarbon having or not having a fluorine-carbon bond and an oxygen, benzocyclobutene, and a benzocyclobutene derivative having or not having a carbon-fluorine bond. Examples of the organic polymer having a carbon-carbon bond in the skeleton thereof include a polyethylene derivative, a polystyrene derivative, a polyvinylphenol derivative, and a teflon derivative. Examples of the organic polymer having a carbon-oxygen or fluorine-carbon bond in the skeleton thereof include perfluoropolyether and fluorinated polyalkylene having an ether bond. Examples of the organic polymer having an aromatic hydrocarbon having or not having a fluorine-carbon bond and an oxygen in the skeleton thereof include polyimide prepolymer, fluorinated polyimide prepolymer, polyallylene, fluorinated polyallylene, and a siloxane-modified polyimide derivative. Examples of the benzocyclobutene derivative include a benzocyclobutene prepolymer and a siloxane-modified benzocyclobutene prepolymer. It is also possible to use, in the side chain or skeleton of each of these organic polymers, an organic polymer having a polar group highly interactive with a silanol group in the silica sol (e.g., an amino group, an imide group, a hydroxyl group, a carbonyl group, a carboxyl group, an amide group, a carbon-carbon unsaturated bond, or the like).

(Seventh Embodiment)

In a seventh embodiment, a first solution of an organic polymer and a second solution of an organic polymer having different compositions are mixed to prepare a mixture solution, which is applied onto a semiconductor substrate formed with a lower metallization layer and thermally treated to form an interlayer insulating film.

(Example)

As the first solution of an organic polymer, 50 ml of a solution of perfluoropolyether (in a concentration of 10 wt %) is prepared, while 100 ml of a solution of polyimide prepolymer (in a concentration of 10 wt %) is prepared as the second solution of an organic polymer. The first and second solutions of the organic polymers are mixed and stirred at room temperature for 3 hours to prepare a solution mixture, which is applied onto a semiconductor substrate by spin coating at 3000 r.p.m., baked on a hot plate oven at a temperature of 150° C. for 2 minutes, and thermally treated in an atmosphere of nitrogen in an electric furnace at a temperature of 400° C. for 30 minutes to prepare an interlayer insulating film having a thickness of about 450 nm. Although the concentration of the first or second solution of an organic polymer in the solution mixture can be determined properly as long as the interlayer insulating film can be formed, it is preferably in the range of about 3 to 20 wt %.

The relative dielectric constant of the interlayer insulating film in the present example is measured by a CV method to be about 2.1.

A silicon dioxide film is deposited by CVD to a thickness of 100 nm on the interlayer insulating film formed in the present example. Subsequently, a pattern with a contact hole is formed from a photoresist deposited on the silicon dioxide film by a normal lithographic process, followed by dry etching performed with respect to the interlayer insulating film and silicon dioxide film to form the contact hole. Thereafter, the photoresist is removed by ashing using an oxygen plasma. The configuration of the contact hole thus formed is observed by using an electronic microscope, with the result that side etching is hardly observed.

The contact resistance of the contact hole formed in the interlayer insulating film in the present example is measured, which is substantially equal to the contact resistance measured in the case of using a normal CVD film as the interlayer insulating film.

By mixing the organic polymers having different compositions, there can be formed the interlayer insulating film having a high heat resistance comparable to the heat resistance of polyimide and a low relative dielectric constant comparable to the relative dielectric constant of perfluoroether, which is lower than the relative dielectric constants of the insulating films formed individually from the two organic polymers. The mixture ratios of the first and second solutions of the organic polymers are preferably in the range of 10 to 90 vol %.

In general, the glass transition temperature of the organic polymer is as low as 200° C. or less. In the semiconductor manufacturing process, an additional thermal treatment such as sintering (400° C. or higher) is performed after the formation of the interlayer insulating film. Accordingly, if the organic polymer low in glass transition temperature is used singly, a volume increase or flow occurs in the interlayer insulating film under the thermal treatment, resulting in various disadvantages including the development of a stress, a break in wiring, a contact failure, and a reduction in reliability. However, since the present embodiment has mixed the organic polymers having different compositions on a molecular level, the glass transition temperature has been increased significantly.

As the first or second solution of an organic polymer, there may be used a solution containing at least one of an organic polymer having in the skeleton thereof a carbon-carbon bond, an organic polymer having in the skeleton thereof a carbon-oxygen bond, an organic polymer having in the skeleton thereof a carbon-fluorine bond, an organic polymer having in the skeleton thereof an aromatic hydrocarbon having or not having a fluorine-carbon bond and an oxygen, benzocyclobutene, and a benzocyclobutene derivative having or not having a carbon-fluorine bond. Examples of the organic polymer having a carbon-carbon bond in the skeleton thereof include a polyethylene derivative, a polystyrene derivative, a polyvinylphenol derivative, and a teflon derivative. Examples of the organic polymer having a carbon-oxygen or fluorine-carbon bond in the skeleton thereof include perfluoropolyether and fluorinated polyalkylene having an ether bond. Examples of the organic polymer having an aromatic hydrocarbon having or not having a fluorine-carbon bond and an oxygen in the skeleton thereof include polyimide prepolymer, fluorinated polyimide prepolymer, polyallylene, fluorinated polyallylene, and a siloxane-modified polyimide derivative. Examples of the benzocyclobutene derivative include a benzocyclobutene prepolymer and a siloxane-modified benzocyclobutene prepolymer. It is also possible to use, in the side chain or skeleton of each of these organic polymers, an organic polymer having a polar group highly interactive with a silanol group in the silica sol (e.g., an amino group, an imide group, a hydroxyl group, a carbonyl group, a carboxyl group, an amide group, a carbon-carbon unsaturated bond, or the like).

Below, methods of manufacturing semiconductor devices using the interlayer insulating film according to each of the foregoing first to seventh embodiments will be described with reference to the drawings.

Initially, the description will be given to the first method of manufacturing a semiconductor device with reference to FIGS. 2.

Figure 2A:
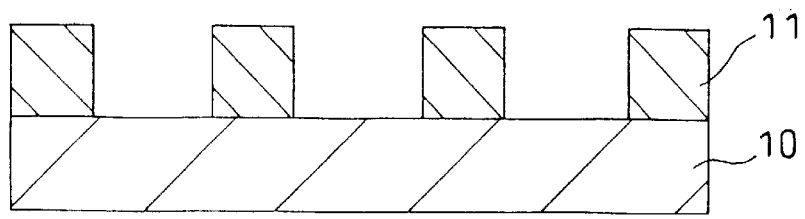
FIGS. 2(a) to 2(d) are cross-sectional views illustrating the individual steps of the method of manufacturing a semiconductor device in each of the first to seventh embodiments according to the present invention.
Figure 2B:
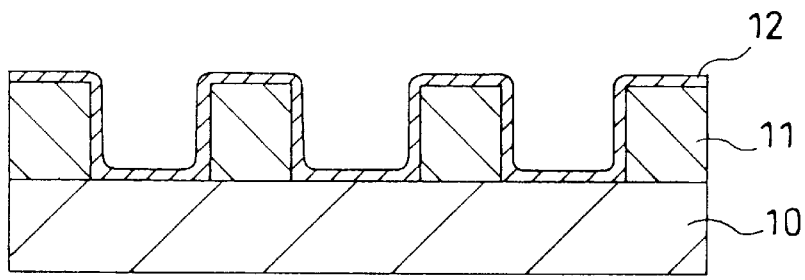
Figure 2C:
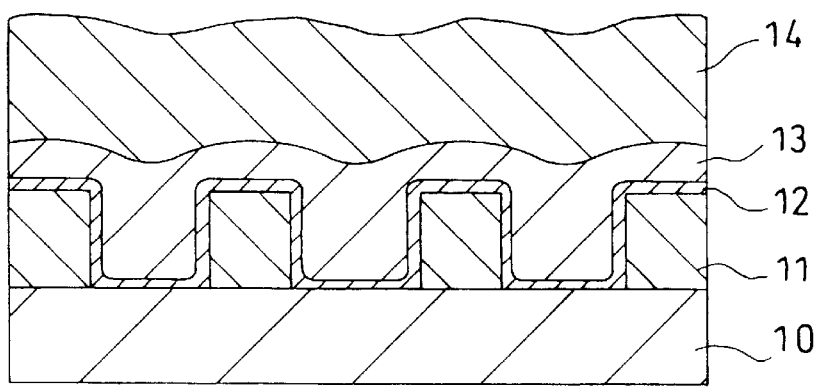
Figure 2D:
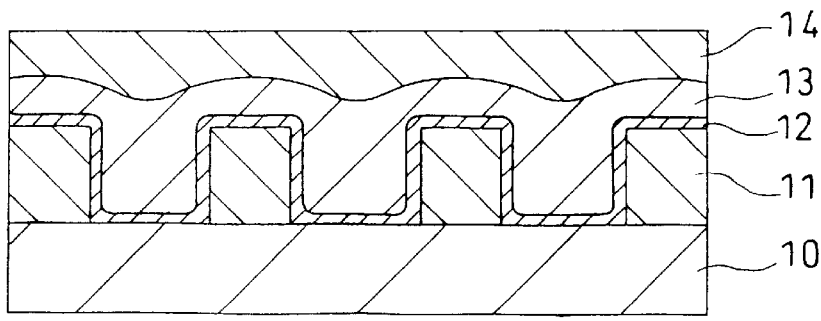

As shown in FIG. 2(a), a lower metallization layer 11 is formed on a semiconductor substrate 10 made of silicon and then a first insulating film 12 composed of a silicon dioxide film is deposited by CVD to a thickness of 50 nm over the entire surface of the semiconductor substrate 10 including the lower metallization layer 11, as shown in FIG. 2(b). Subsequently, as shown in FIG. 2(c), an interlayer insulating film 13 having a thickness of 300 nm according to each of the first to seventh embodiments and a second insulating film 14 composed of a silicon dioxide film having a thickness of 500 nm are formed sequentially over the entire surface of the first insulating film 12, followed by a reflow process for planarizing the second insulating film 14 as shown in FIG. 2(d). Thereafter, an upper metallization layer is formed on the second insulating film 14 by a known method, though the drawing thereof is omitted.

Next, the description will be given to the second method of manufacturing a semiconductor device with reference to FIGS. 3.

Figure 3A:
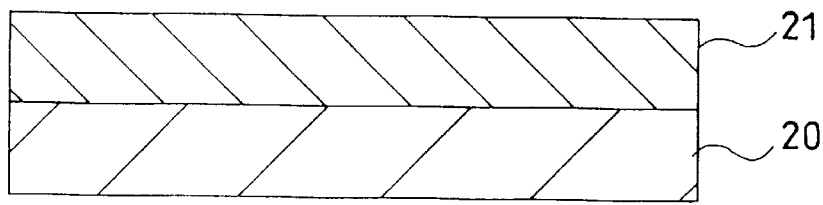
FIGS. 3(a) to 3(d) are cross-sectional views illustrating the individual steps of the method of manufacturing a semiconductor device in each of the first to seventh embodiments according to the present invention.
Figure 3B:
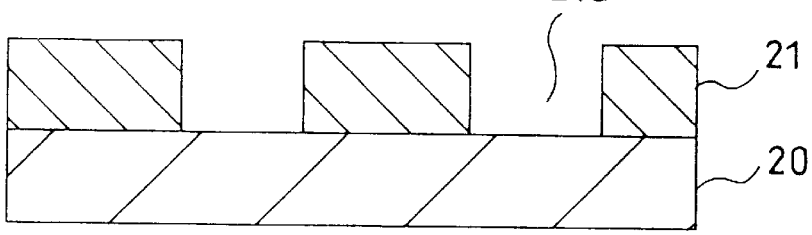
Figure 3C:
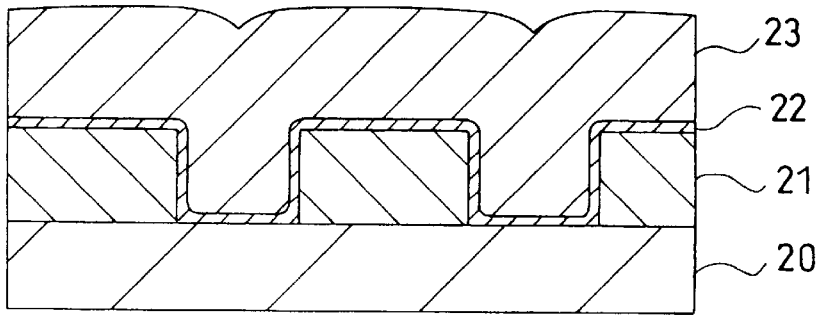
Figure 3D:
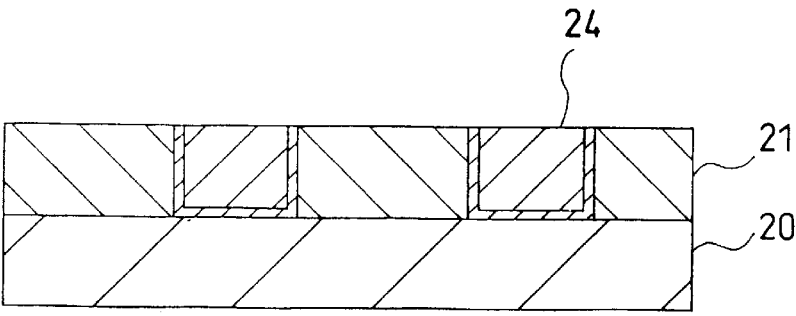

As shown in FIG. 3(a), an interlayer insulating film 21 according to each of the first to seventh embodiments is deposited to a thickness of 300 nm over the entire surface of a semiconductor substrate 20 made of silicon and formed with a lower metallization layer. Then, the interlayer insulating film 21 is etched using a resist pattern as a mask so that a groove 21a serving as an interconnection region is formed therein, as shown in FIG. 3(b). Thereafter, a first metal layer 22 composed of Ti and TiN (each having a thickness of 50 nm) is deposited by CVD or sputtering and a second metal layer 23 made of Cu is further deposited to a thickness of 500 nm on the first metal layer 22 by CVD or sputtering. Thereafter, the first and second metal layers 22 and 23 are subjected to chemical mechanical polishing (CMP) for removing these portions of the first and second metal layers 22 and 23 exposed at the surface of the interlayer insulating film 21, thereby forming a buried interconnection 24 as an upper metallization layer composed of the first and second metal layers 22 and 23 in the groove 21a.

It is also possible to selectively deposit an oxide film on the interlayer insulating film 21 between the step of forming the groove 21a in the interlayer insulating film 21 and the step of forming the first metal layer 22 or to modify the surface quality of the interlayer insulating film 21 by ion implantation or plasma processing, thereby improving the adhesion of the first and second metal layers 22 and 23 to the interlayer insulating film 21 and controlling degassing from the interlayer insulating film 21.

We claim:

1. A method of manufacturing a semiconductor device, comprising:

a lower-metallization-layer forming step of forming a lower metallization layer on a semiconductor substrate;

an insulating-film forming step of forming an inter layer insulating film on said lower metallization layer; and an upper-metallization-layer forming step of forming an upper metallization layer on said interlayer insulating film, wherein said interlayer insulating film is formed by: mixing a first solution of a silica sol which is a solution of a particulate silanol condensate having a fluorine-silicon bond and a second solution of a silica sol which is a solution of a particulate silanol condensate having an organic group-silicon bond to obtain a solution mixture; applying said solution mixture onto the semiconductor substrate formed with said lower metallization layer; and thermally treating the applied solution mixture.

2. A method of manufacturing a semiconductor device, comprising:

a lower-metallization-layer forming step of forming a lower metallization layer on a semiconductor substrate:

an insulating-film forming steep of forming an interlayer insulating film on said lower metallization layer; and an upper-metallization-layer forming step of forming an upper metallization layer on said interlayer insulating film, wherein said interlayer insulating film is formed by: mixing a first solution of a silica sol which is a solution of a particulate silanol condensate having a fluorine-silicon bond and a second solution of a silica sol which is a solution of a particulate silanol condensate having a hydrogen-silicon bond, to obtain a solution mixture; applying said solution mixture onto the semiconductor substrate formed with said lower metallization layer; and thermally treating the applied solution mixture.

3. A method of manufacturing a semiconductor device, comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said interlayer insulating film is formed by: mixing a first solution of a silica sol which is a solution of a particulate silanol condensate having a first organic group-silicon bond and a second solution of a silica sol which is a solution of a particulate silanol condensate having a second organic group-silicon bond different from said first organic group-silicon bond, to obtain a solution mixture; applying said solution mixture onto the semiconductor substrate formed with said lower metallization layer; and thermally treating the applied solution mixture.

4. A method of manufacturing a semiconductor device, comprising:

a lower-metallization-layer forming step of forming a lower metallization layer on a semiconductor substrate:

an insulating-film forming step of forming an interlayer insulating film on said lower metallization layer; and an upper-metallization-layer forming step of forming an upper metallization layer on said interlayer insulating film, wherein said interlayer insulating film is formed by: mixing a fist solution of a silica sol which is a solution of a particulate silanol condensate having an organic group-silicon bond and a second solution of a silica sol which is a solution of a particulate silanol condensate having a hydrogen-silicon bond, to obtain a solution mixture; applying said solution mixture onto the semiconductor substrate formed with said lower metallization layer; and thermally treating the applied solution mixture.

5. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a solution of a ladder siloxane polymer and a solution of a silica sol to prepare a solution mixture, applying said solution mixture onto the semiconductor substrate formed with said lower metallization layer, and thermally treating the applied solution mixture to form said interlayer insulating film.

6. A method of manufacturing a semiconductor device according to claim 5, wherein said solution of a silica sol is a solution of a particulate silanol condensate having a hydrogen-silicon bond, a solution of a particulate silanol condensate having an oxygen-silicon bond, a solution of a particulate silanol condensate having an organic group-silicon bond, or a solution of a particulate silanol condensate having a fluorine-silicon bond.

7. A method of manufacturing a semiconductor device according to claim 5, wherein said solution mixture is prepared by mixing said solution of a ladder siloxane polymer in a concentration of 10 to 90 wt % in terms of $SiO_2$ and said solution of a silica sol in a concentration of 90 to 10 wt % in terms of $SiO_2$.

8. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a solution of an organic polymer and a solution of a silica sol to prepare a solution mixture, applying said solution mixture onto the semiconductor substrate formed with said lower metallization layer, and thermally treating the applied solution mixture to form said interlayer insulating film.

9. A method of manufacturing a semiconductor device according to claim 8, wherein said solution of an organic polymer contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond.

10. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a solution of a ladder siloxane polymer and a solution of an organic polymer to prepare a solution mixture, applying said solution mixture onto the semiconductor substrate formed with said lower metallization layer, and thermally treating the applied solution mixture to form said interlayer insulating film.

11. A method of manufacturing a semiconductor device according to claim 10, wherein said solution of an organic polymer contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond.

12. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a solution of polyhedral silsesquioxane and a solution of a silica sol to prepare a solution mixture, applying said solution mixture onto the semiconductor substrate formed with said lower metallization layer, and thermally treating the applied solution mixture to form said interlayer insulating film.

13. A method of manufacturing a semiconductor device according to claim 12, wherein said silica sol solution is a solution of a particulate silanol condensate having a hydrogen-silicon bond, a solution of a particulate silanol condensate having an oxygen-silicon bond, a solution of a particulate silanol condensate having an organic group-silicon bond, or a solution of a particulate silanol condensate having a fluorine-silicon bond.

14. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a solution of polyhedral silsesquioxane and a solution of an organic polymer to prepare a solution mixture, applying said solution mixture onto the semiconductor substrate formed with said lower metallization layer, and thermally treating the applied solution mixture to form said interlayer insulating film.

15. A method of manufacturing a semiconductor device according to claim 14, wherein said solution of an organic polymer contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond.

16. A method of manufacturing a semiconductor device comprising:

a lower-metallization-layer forming step of forming a lower metallization layer on a semiconductor substrate;

an insulating-film forming step of forming an interlayer insulating film on said lower metallization layer; and an upper-metallization-layer forming step of forming an upper metallization layer on said interlayer insulating film, wherein said insulating-film forming step includes a step of mixing a first solution of an organic polymer and a second solution of an organic polymer having different compositions to prepare a solution mixture, applying said solution mixture onto the semiconductor substrate formed with said lower metallization layer, and thermally treating the applied solution mixture to form said interlayer insulating film.

17. A method of manufacturing a semiconductor device according to claim 16, wherein said first solution of an organic polymer contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond.

18. A method of manufacturing a semiconductor device according to claim 17, wherein said second solution of an organic polymer contains at least one of a solution of an organic polymer having a carbon-carbon bond as a skeleton, a solution of an organic polymer having a carbon-oxygen bond as a skeleton, a solution of an organic polymer having a fluorine-carbon bond as a skeleton, a solution of an organic polymer having, as a skeleton, an oxygen and an aromatic hydrocarbon having or not having a fluorine-carbon bond, a solution of benzocyclobutene, and a solution of a benzocyclobutene derivative having or not having a carbon-fluorine bond and has a composition different from the composition of said first solution of an organic polymer.

* * * * *